United States Patent [19]
Yamada et al.

[11] Patent Number: 5,327,022
[45] Date of Patent: Jul. 5, 1994

[54] MULTIPLEXER CIRCUIT LESS LIABLE TO MALFUNCTION

[75] Inventors: Shigeru Yamada, Yokohama; Isao Abe; Tsutomu Takahashi, both of Kawasaki, all of Japan

[73] Assignee: Kabushiki Kaisha Toshiba, Kawasaki, Japan

[21] Appl. No.: 885,363

[22] Filed: May 19, 1992

[30] Foreign Application Priority Data

May 20, 1991 [JP] Japan .................................. 3-114928

[51] Int. Cl.⁵ ........................ G11C 8/00; H03K 19/20
[52] U.S. Cl. .................................. 307/443; 307/449; 307/463
[58] Field of Search .......................... 307/449, 463; 365/230.06, 189.02

[56] References Cited

U.S. PATENT DOCUMENTS

| | | | |
|---|---|---|---|
| 4,583,205 | 4/1986 | Watanabe | 307/463 |
| 4,642,798 | 2/1987 | Rao | 307/449 |
| 4,691,301 | 9/1987 | Anderson | 365/200 |
| 4,985,647 | 1/1991 | Kawada | 307/449 |
| 5,159,215 | 10/1992 | Murotani | 307/449 |

Primary Examiner—Edward P. Westin
Assistant Examiner—Andrew Sanders
Attorney, Agent, or Firm—Finnegan, Henderson, Farabow, Garrett & Dunner

[57] ABSTRACT

A multiplexer circuit comprises a plurality of circuits for decoding digital timing signals, and a plurality of circuits for passing an one of the analogue voltage potentials to an output terminal corresponding to the decoded result of the decoding circuits, and preventing the passing circuits from passing more than one signal simultaneously.

14 Claims, 9 Drawing Sheets

MULTIPLEXER CIRCUIT LESS LIABLE TO MALFUNCTION

BACKGROUND OF THE INVENTION

1. Field of the Invention

This invention relates to a CMOS multiplexer circuit capable of receiving a plurality of digital signals and then producing an analog potential corresponding to those digital signals.

2. Description of the Related Art

To drive the liquid-crystal panels of image processing systems, for example, CMOS multiplexer circuits are generally used to supply a suitable driving potential to the panels. The multiplexer circuit is supplied with analog potentials of different magnitudes, and is also supplied with a select signal, mostly a digital signal. The select signal selects and turns on one of the supply gates each connected to the analog potentials to supply an analog potential to, for example, the liquid-crystal panel connected.

when the digital select signals pass through the logic circuits for decoding, the transfer gates are not always controlled by the respective control signals with the same timing. Delays in timing are ascribed to the circuit configuration of the inverter circuits or NAND circuits for logical processing, the capacitance, and others. Such timing delay leads to the faulty operation of the multiplexer's supply gates turning on at the same time. In the multiplexer circuit, when the supply gates turn on simultaneously, this causes the analog potentials to short-circuit one another, resulting in the improper output. The change of the well potential due to the short circuit makes the potential of the p-type substrate higher than the n-type substrate potential, creating the problem of permitting the CMOS IC of the multiplexer to latch up.

SUMMARY OF THE INVENTION

It is an object of the present invention to provide a multiplexer circuit capable of preventing the output gate from malfunctioning on account of errors in the timing of a plurality of digital signals supplied.

A multiplexer circuit according to the present invention, comprises: a plurality of means for decoding digital timing signals; and a plurality of means for passing an one of the analogue voltage potentials to an output terminal corresponding to the decoded result of the decoding means, and preventing the passing means from passing more than one signal simultaneously.

The multiplexer circuit of the present invention further comprises means for supplying a timing signal to the decoding means at the time when the digital signals change, preventing the passing means from turning on simultaneously.

In the multiplexer circuit, there are slight delays in the timing of the control signals directly controlling the respective transfer gates, since there are differences in configuration between the logic circuits of the decoder circuit, and variations in the capacitance in the circuit. Such timing delay arises the problem of a plurality of passing means turning on simultaneously.

With the arrangements described above, however, the foregoing object is accomplished as follows. The supplying means produces a timing signal at the time when the digital signals change, and then supplies it to the decoding means. The timing signal is supplied to the decoding means (110 to 117) at the time when a transfer gate to be turned on is changed to another, resulting in all transfer gates turning off temporarily. This prevents the passing means from being affected by the timing delay, making it impossible for two transfer gates to turn on simultaneously. As a result, the occurrence of troubles, such as latching up, can be avoided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, embodiments of the present invention will be explained.

Figure 1:
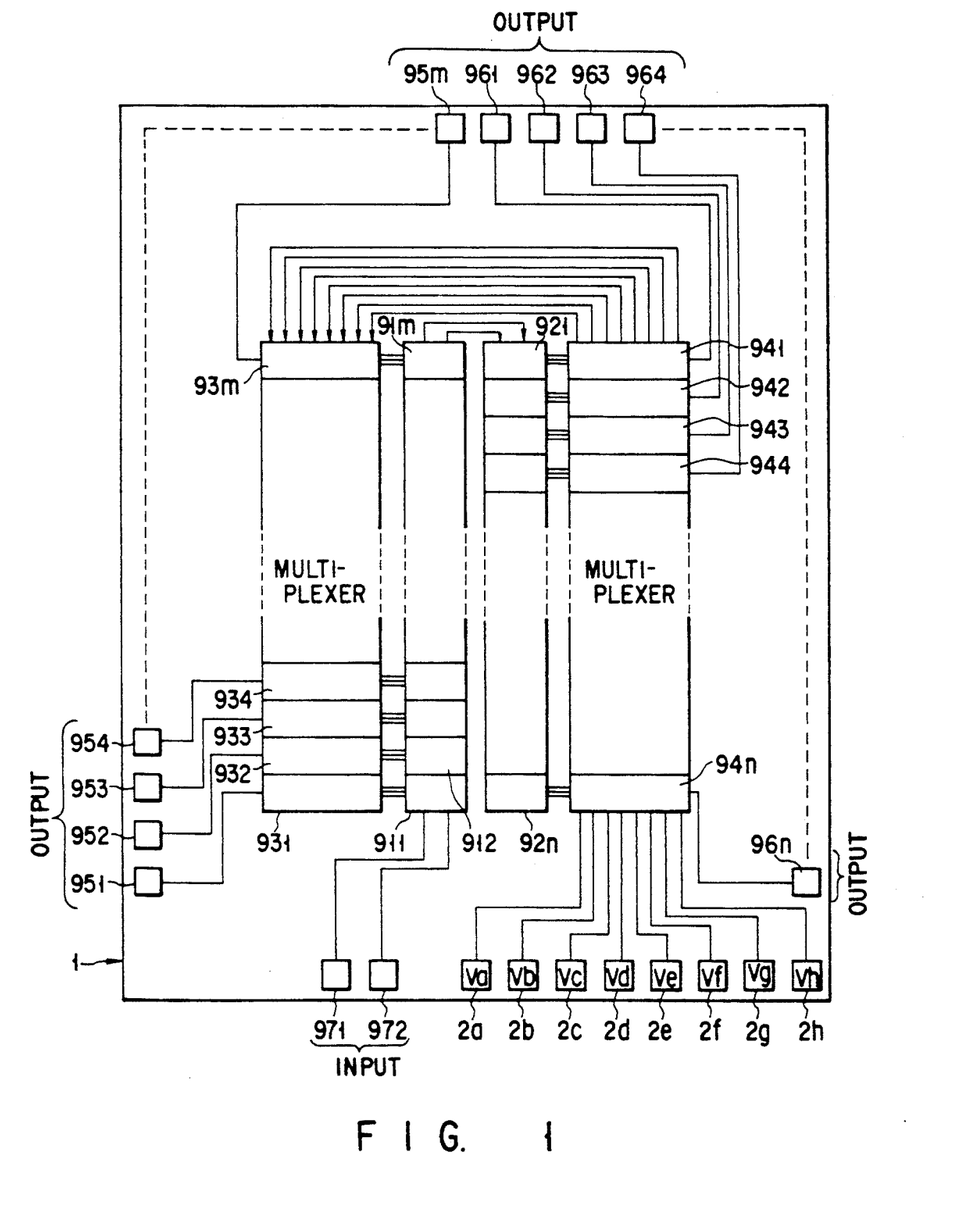
FIG. 1 shows a pattern layout of the circuit blocks and terminals of a liquid-crystal panel driving CMOS integrated circuit device into which many multiplexer circuits of the present invention are incorporated.

FIG. 1 shows a pattern layout of the block structure and terminals (pads) of a liquid-crystal panel driving CMOS integrated circuit device 1 into which many multiplexer circuits according to an embodiment of the present invention are incorporated.

In the figure, power supply pads 2a to 2h are externally applied with liquid-crystal panel driving input potentials Va to Vh, respectively. Decoder input data (decode signal) generator circuits 911 to 91m and 921 to 92n produce a decode signal. Multiplexers 931 to 93m and 941 to 94n are supplied with the decode signals from the decode signal generator circuits 911 to 91m and 921 to 92n, respectively, and are also supplied equally with the input potentials Va to Vh from the power supply pads 2a to 2h. Driving output pads 951 to 95m and 961 to 96n, which are supplied respectively with the select outputs of the multiplexers 931 to 93m and 941 to 94n, supply the driving signals to a single line of respective elements of the liquid-crystal panel (not shown) to be driven. A data signal externally supplied to a data input pad 971 is supplied to the first stage 911 of the decode signal generator circuit. A clock signal externally supplied to a clock input pad 972 is supplied to the decode signal generator circuit 911 to 91m and 921 to 92n. The power supply pad externally supplied with the power supply potential Vcc (an operating power supply) and the ground pad for the ground potential Vss are not shown here.

Figure 2A:
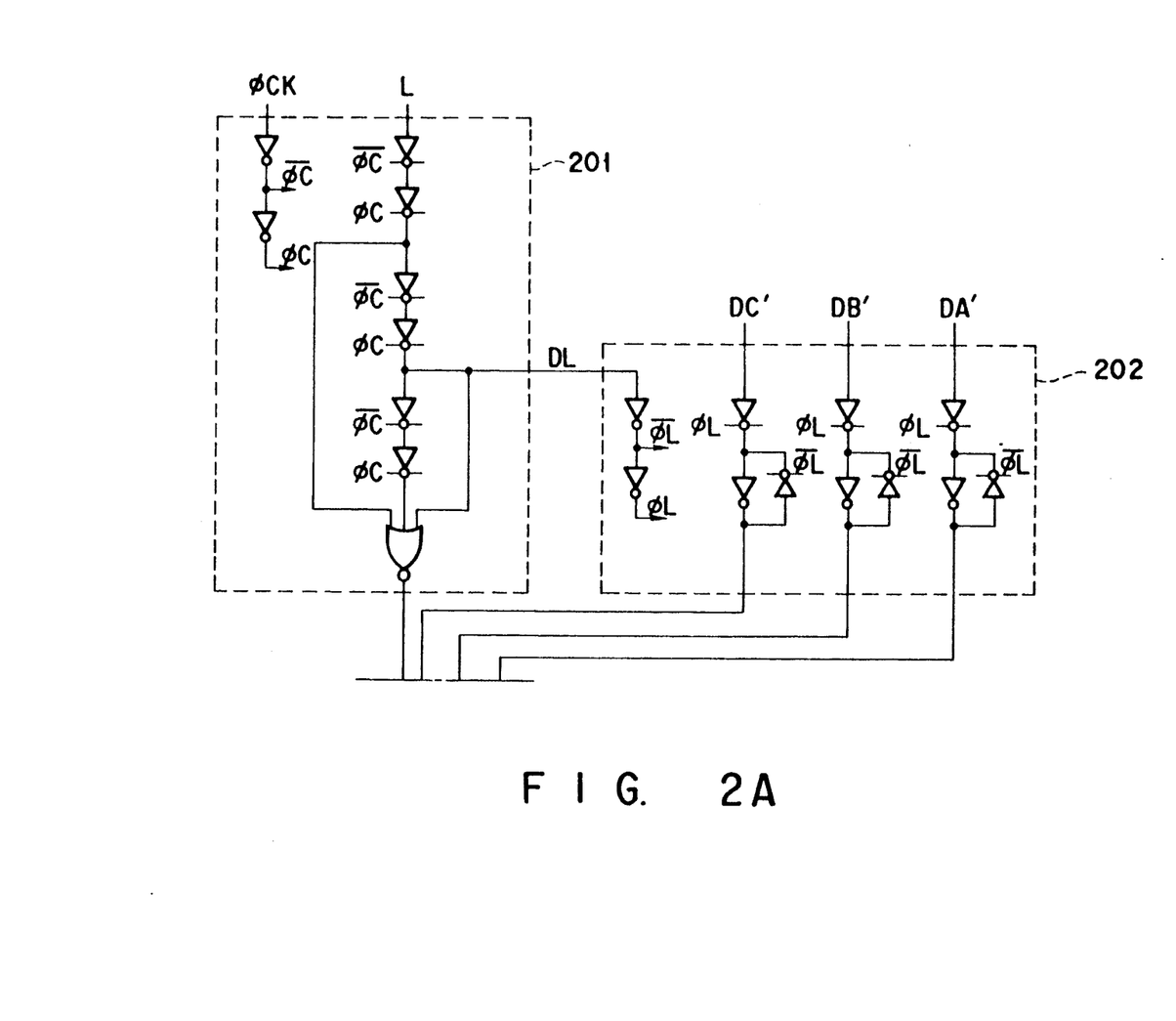
FIGS. 2A and 2B are circuit diagrams of a multiplexer circuit according to an embodiment of the present invention.
Figure 2B:
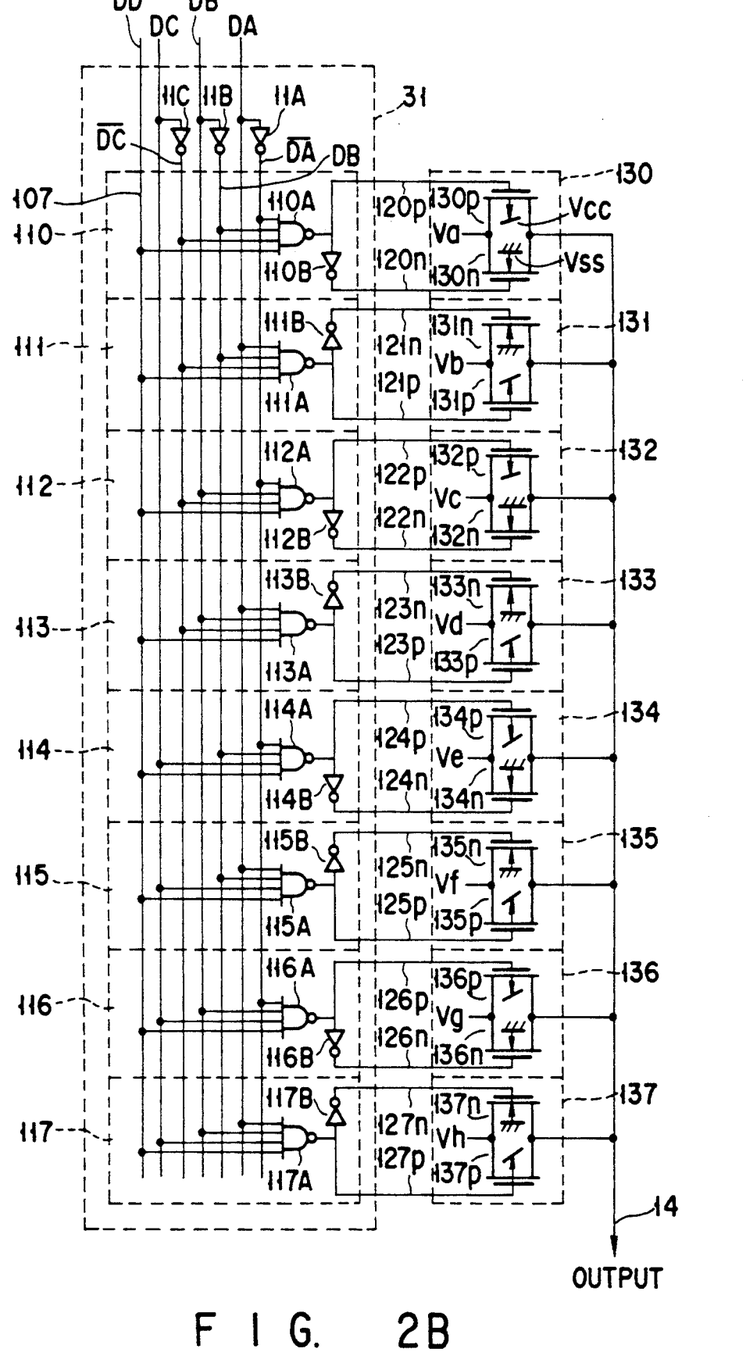

FIG. 2 is a circuit diagram of one of the multiplexers 931 to 93m and 941 to 94n of FIG. 1, in accordance with its pattern layout. In the figure, numeral 11 indicates a decoder section, and DA, DB, and DC decode signals. In the decoder section 11, reference characters 11A, 11B, and 11C indicate CMOS inverters; $\overline{DA}$, $\overline{DB}$, and $\overline{DC}$ the decode signals on the output side of the inverters 11A, 11B, and 11C, respectively; 101 to 106 decoder signal lines; 110 to 117 decoders; and 120p, 127p to 120n, 127n decoder output lines. In the decoders 110 to 117, 110A to 117A indicate 3-input NAND gates, and 110B to 117B CMOS inverters. Numerals 130 to 137 represent transfer gates made up of MOS transistors (for example, CMOS transfer gates), and 14 multiplexer output line. In the transfer gates 130 to 137, reference characters 130p to 137p denote PMOS transistors, and 130n to 137n NMOS transistors.

The transfer gates 130 to 137 are arranged in a line on the semiconductor substrate. The decoders 110 to 117, which turn on and off the transfer gates 130 to 137, respectively, are placed so as to adjoin the transfer gates. The decode signal lines are placed in the same direction in which the decoder 110 to 117 are arranged.

The decoders 110 to 117 are supplied with the control signal DD from the control signal generator circuit 201, while being supplied with the digital control signals DA to DC from the data load circuit 202. The control signal generator circuit 201 supplies a clock signal DL to the data load circuit 202 to clock the operation timing.

Figure 4:
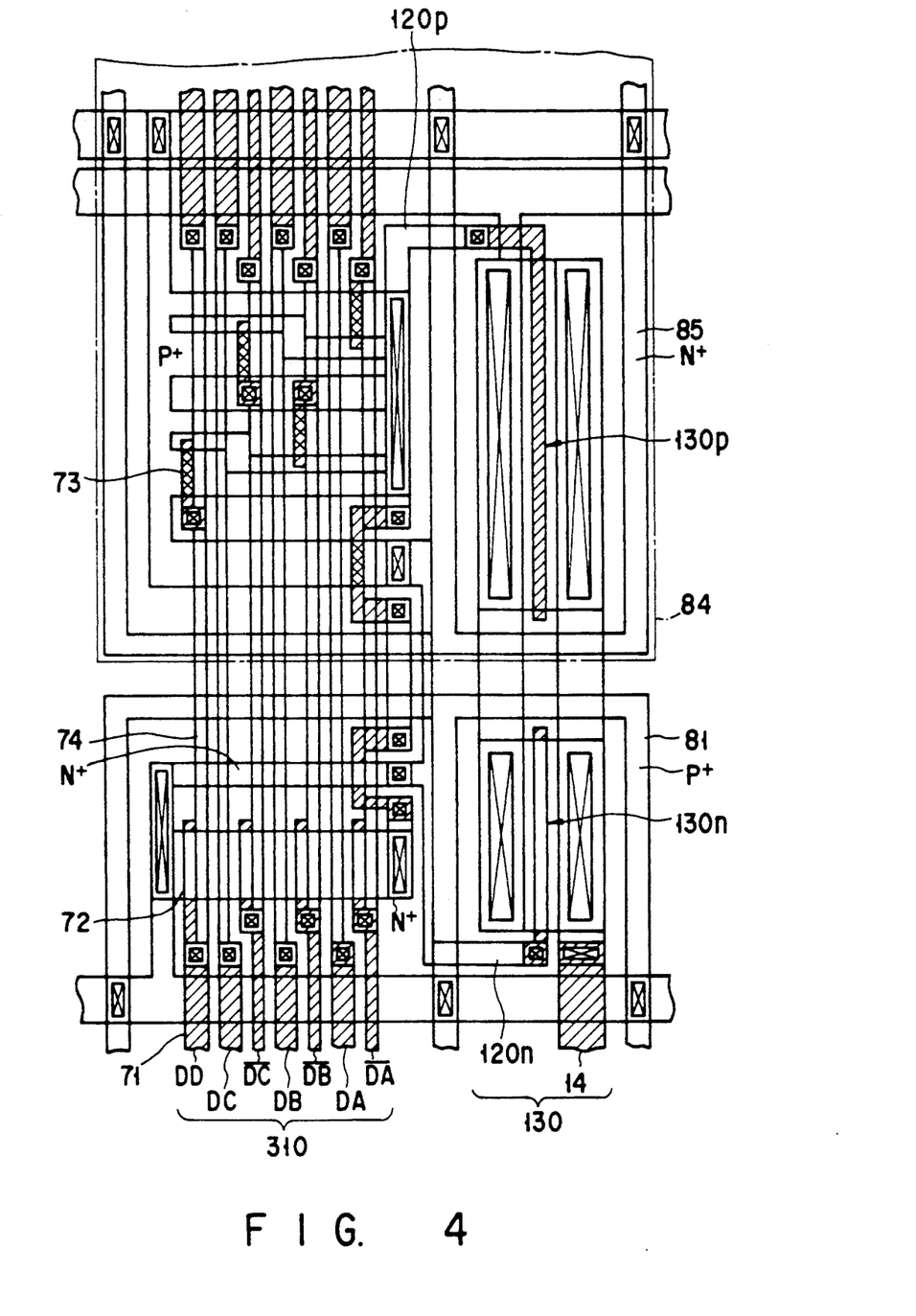
FIG. 4 shows a mask pattern associated with the circuit pattern of the FIG. 2 embodiment.
Figure 7:
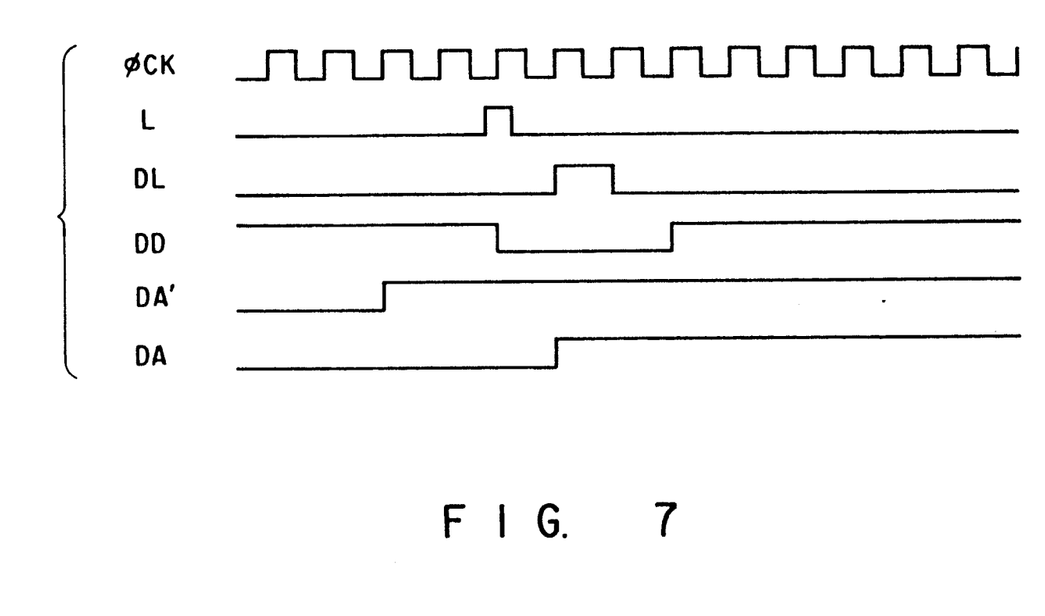
FIG. 7 is a timing chart for the timing signal generator circuit of the FIG. 2 embodiment.

FIG. 4 depicts a portion (the decoder 110 and transfer gate 130) of the pattern of FIG. 7 multiplexer. In the figure, numeral 71 indicates a polysilicon interconnection line; 72 the gate electrode (a portion of the polysilicon interconnection line) of an NMOS transistor; 73 the gate electrode (a portion of the polysilicon interconnection line) of a PMOS transistor; 74 an aluminum interconnection line; 75 a contact portion between the polysilicon interconnection line and the aluminium interconnection line; 76 a contact portion between the p$^+$-type diffused region and the aluminium interconnection line; and 77 a contact portion between the n$^+$-type diffused region and the aluminium interconnection line.

Specifically, the NMOS transistor of decoder 110 and the NMOS transistor of transfer gate 130 are formed in the p-type substrate. The p$^+$-type diffused region 81 in the p-type substrate is connected to the ground potential line (aluminium interconnection line) 82 at the contact portion 76. The PMOS transistor of decoder 110 and the PMOS transistor of transfer gate 130 are formed in the n-type well region 84 of the p-type substrate. The n$^+$-type diffused region 85 in the p-type well region 84 is connected to the Vcc power supply line (aluminium interconnection line) 86 at the contact portion 77. The decode signals DA, DB, DC and $\overline{DA}$, $\overline{DB}$, $\overline{DC}$ are transmitted via the polysilicon interconnection line 71 and aluminium interconnection line 74. The polysilicon interconnection line 71, which transmits decode signals $\overline{DA}$, $\overline{DB}$, $\overline{DC}$, is connected to the gate electrode 72 of each of three NMOS transistors connected in series and to the gate electrode 73 of each of three PMOS transistors connected in parallel in the 3-input NAND gate 110A. One end (the drain, n$^+$-type diffused region) of the series-connected NMOS transistors is connected to the gate electrode 72 of NMOS transistor and the gate electrode 73 of PMOS transistor in the CMOS inverter 110B via the aluminium interconnection line 74 and polysilicon interconnection line 71. The source (the n$^+$-type diffused region) of NMOS transistor of the CMOS inverter 110B and the other end (the source, n$^+$-type diffused region) of the series-connected NMOS transistors of the 3-input NAND gate 110A are connected to the ground potential line 82 at the contact portion 77. The source (the p$^+$-type diffused region) of PMOS transistor of the CMOS inverter 110B and the source (the p$^+$-type diffused region) of each of the parallel-connected PMOS transistors of the 3-input NAND gate 110A are connected to the Vcc power supply line 86 at the contact portion 76. The drain (the p$^+$-type diffused region) of each of the parallel-connected PMOS transistors of the 3-input NAND gate 110A is connected to one end (the drain, n$^+$-type diffused region) of the series-connected NMOS transistors of the 3-input NAND gate 110A. The junction (the output node) of the drains is connected to the gate electrode 73 of the PMOS transistor 130p of the transfer gate 130 via the decoder output line 120p (the aluminium interconnection line). The drain (the p$^+$-type diffused region) of the PMOS transistor of the CMOS inverter 110B is connected to the drain (the n$^+$-type diffused region) of the NMOS transistor of the CMOS inverter 110B via the aluminium interconnection line 74. The junction (the output node) of the drains is connected to the gate electrode 72 of the NMOS transistor 130n of the transfer gate 130 via the decoder output line 120n (the aluminium interconnection line). One end of each of the NMOS transistor 130n and PMOS transistor 130p of the transfer gate 130 is connected to one another via the aluminium interconnection line 74, and the resulting junction is further connected to the input potential line (the aluminium interconnection line) 87 for supplying the input potential Va. The other end of each of the NMOS transistor 130n and PMOS transistor 130p of the transfer gate 130 is connected to one another via the aluminium interconnection line 74, and the resulting junction is further connected to the multiplexer output line 14.

The operation of the FIG. 2 multiplexer will be described. The decoders 110 to 117 operate in response to the decode signals DA, DB, and DC, which causes the proper one of the decoder output line pairs 120p, 120n to 127p, 127n to go to a level that turns on the transfer gates 130 to 137 (that is, to a low level for the PMOS transistor, and to a high level for the NMOS transistor). Based on the output of the decoder 110 to 117, one of the transfer gates 130 to 137 turns on to select one of the input potentials Va to vh and supply it onto the multiplexer output line 14.

FIG. 4 illustrates a portion (the decoder 110 and transfer gate 130) of the pattern of the FIG. 2 multiplexer. In the pattern, the decode signal DD is transmitted via the polysilicon interconnection line 71 and aluminium interconnection line 74. The polysilicon interconnection line 71 is connected to the gate electrode 72 of one of the four NMOS transistors connected in series, and to the gate 73 electrode of one of the four PMOS transistors connected in parallel in the 4-input NAND gate 110.

In the multiplexer of the above embodiment, a plurality of transfer gates are placed in a line, and a plurality of transfer gates for on/off control of the respective transfer gates are provided so as to adjoin the respective gates. This arrangement shortens the interconnection lines between the decoder groups and transfer gate groups, which makes it possible to reduce the interconnection area substantially, resulting in the reduced pattern of the multiplexer.

A conventional multiplexer pattern measured 266 μm×3800 μm. In contrast, the multiplexer pattern of the above embodiment measures 72 μm×2600 μm, which means that the pattern area of the embodiment is reduced by 0.4 times that of the conventional one.

Accordingly, when many multiplexers of the same function are squeezed in the integrated circuit device as shown in FIG. 1, it is possible to suppress an increase in the chip size.

For the FIG. 2 multiplexer, it is desirable to take measures regarding the following items (a) and (b): (a) the interconnection area for the input signals to the decoder groups are required in the vicinity of the transfer gate groups; and (b) the power supply interconnection area for decoder groups is needed in the vicinity of the transfer gate groups.

About item (a), when the MOS transistors constituting the decoders are formed below the input-signal interconnection area, this prevents the interconnection area for the input signals to the decoder groups from wasting space.

About item (b), when the decoder power supply potential is supplied as the substrate potential of the transfer gate, this prevents the decoder power supply interconnection area from wasting space. Such a sufficient supply of the substrate potential to the transfer gates makes it possible to stabilize the operation of the transfer gates.

Figure 8:
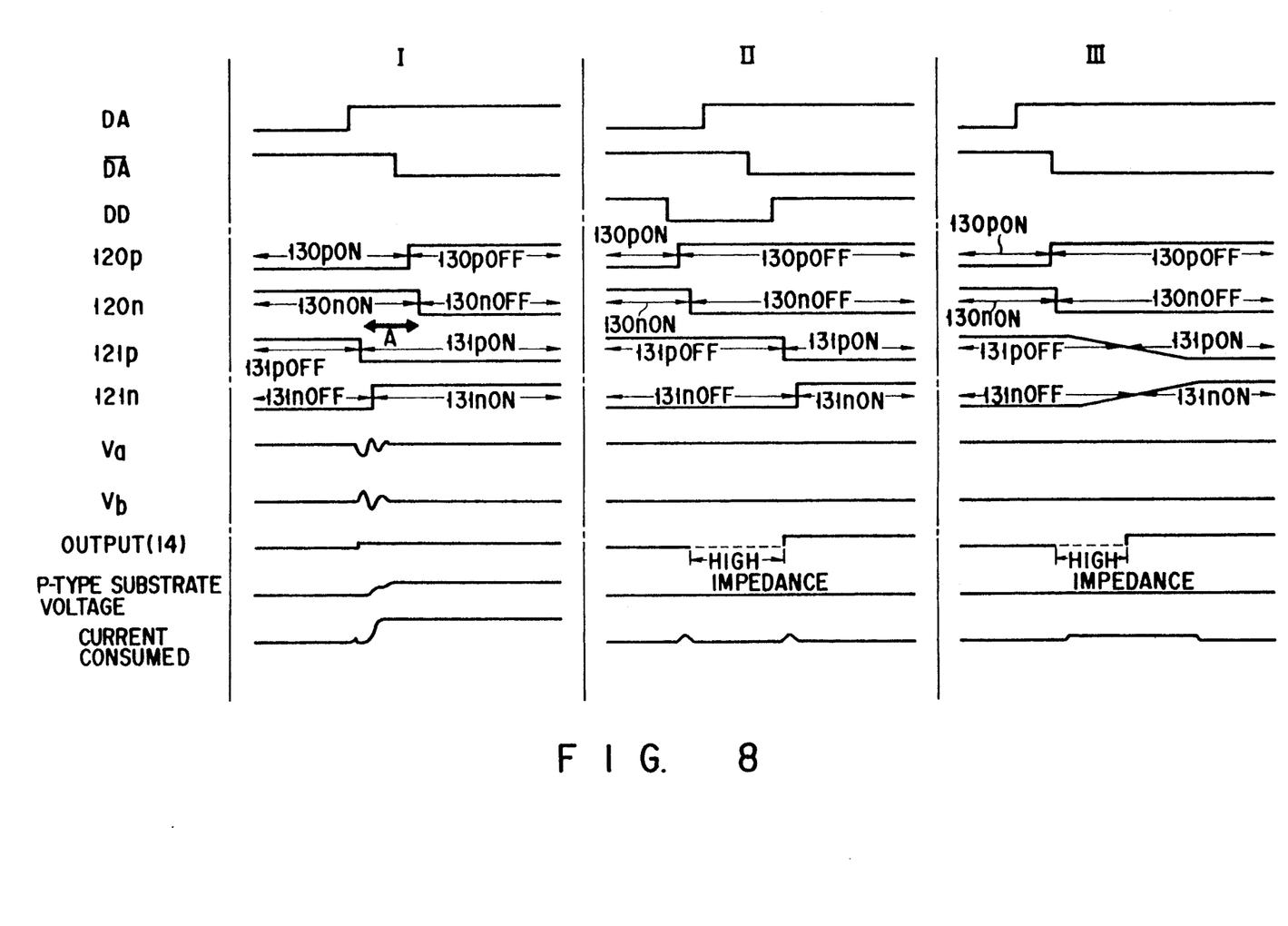
FIG. 8 is a timing chart for explaining the feature of the present invention that avoids the faulty operation.

FIG. 7 is a timing chart for the timing signal generator 201. FIG. 8 is a timing chart for explaining the latching up of the multiplexer circuit of the present invention and its measures. How the transfer gates 130 and 131 latch up will be explained in a case where the decode signals DA, DB, and DC change from (0, 0, 0) to (0, 0, 1), referring to the FIG. 2 circuit diagram, and the timing charts of FIGS. 7 and 8.

As shown in column I of FIG. 8, the NAND circuit 110A, receiving signals $\overline{DA}$, $\overline{DB}$, and $\overline{DC}$, changes its output 120p from 0 to 1, which causes the inverter 110B that reverses the signal to change its output 120n from 1 to 0. This switches the transfer gate 130 from the on to the off state, the gate receiving the outputs 120p and 120n as control signals. On the other hand, the adjacent NAND circuit 111A, receiving signals DA, $\overline{DB}$, and $\overline{DC}$, changes its output 121p from 0 to 1, which causes the inverter 111B that reverses the signal to change its output 120n from 0 to 1. This switches the transfer gate 131 from the off to the on state, the gate receiving the outputs 121p and 121n as control signals. In the proper operation, as a result of these actions, the output 14 is switched from the potential of power supply Va (gate 130 on and gate 131 off) to that of power supply Vb (gate 130 off and gate 131 on).

The inverted signal $\overline{DA}$, however, is changed from 1 to 0, lagging a little behind the timing with which DA changed from 0 to 1, as shown in FIG. 8, because the inverter 11A and signal lines have the load capacitance. This slight delay in the timing permits the period of time A during which both control signals 120p and 121p are a 0, and both 120n and 121n are a 1, causing both transfer gates 120 and 121 to turn on. When both transfer gates 130 and 131 turn on simultaneously, the output power supplies va and Vb are short-circuited via these transfer gates, causing the respective potentials to fluctuate unless both power supplies va and Vb are at the same potential. If the variations in the power supply potential are large, this will fluctuate the potential of the p-type substrate of the decoders 110 and 111. The fluctuations in the substrate potential will trigger the latching up in the thyristor structure composed of the p-type source diffusion, n-type well, p-type substrate, and n-type source diffusion in the decoder section, which might lead to the destruction of the LSI in the worst case. In FIG. 8, in column I, latching up takes place at time A, and the p-type substrate voltage rises extremely, which causes current to flow from the power supply potential to the ground potential, resulting in an extremely high drawn current.

To avoid the simultaneous switching of the transfer gates, for example, the decoder may be provided with the function of turning off all transfer gates simultaneously; it first turns off all transfer gates at the time when the decoder output changes, and then turns on the desired transfer gate. Another way to avoid this problem is as follows. In the logic gate (3-input NAND gate) of the decoder that controls the transfer gate's PMOS transistor, the driving capability of the PMOS transistor is set larger than that of the NMOS transistor, whereas in the NOT gate (CMOS inverter) of the decoder that controls the transfer gate's MOS transistor, the driving capability of the NMOS transistor is set larger than that of the PMOS transistor. As a result of such setting, the transfer gate turns off faster, but turns on slower, which creates a sufficient period of time that allows all transfer gates to turn off, thereby preventing the transfer gates from turning on simultaneously.

Referring to the FIG. 2 circuit diagram and the timing chart shown in column II of FIG. 8, an explanation will be given as to how the control signal DD from the control signal generator circuit 201 brings all transfer gates into a high impedance state at the time when the output of the multiplexer circuit changes to prevent the transfer gates from turning on simultaneously.

In the FIG. 2 circuit diagram, with decode signals DA, DB, and DC in the (0, 0, 0) state, when DD changes from 1 to 0, the output 120p of the NAND circuit 110A changes from 0 to 1, which causes the output of inverter 110B to change from 1 to 0, resulting in the transfer gate 130 changing from the on to the off state. Even if DA, DB, and DC change from (0, 0, 0) to (0, 0, 1) during the time when DD remain in the 0 state, the outputs 120p to 127p of all NAND circuits 110A to 117A remain in the 1 state, which causes the outputs 120n to 127n of the inverters 110B to 117B to remain in the 0 state, thereby resulting in all transfer gates 130 to 137 remaining in the off state.

Next, when DD changes from 0 to 1, the output 121p of NAND circuit 111A switches from 1 to 0, causing the output 121n of inverter 111B to change from 0 to 1. This switches the transfer gate 131, receiving the outputs 121p and 121n, from the on to the off state.

By turning off all transfer gates by the control input signal DD at the time when the input data changes, the simultaneous turning on of two or more transfer gates can be prevented, eliminating a possibility of the transfer gates latching up.

The control signal DD is produced by the control signal generator circuit 201 of FIG. 2. As shown in FIG. 7, the changeover signal L goes active to change the transfer gates used before the digital signals DA to DC and others are switched. After the changeover signal L has become active, DD is active for a specified period of time, during which the digital signals DA to DC switch to the proper states to specify new transfer gates. Thus, the active control signal DD causes all transfer gates to remain in the off state for a specified period of time. The data load circuit 202 clock-adjusts the digital signals DA' to DC', the former signals of DA to DC, and the control signal DD.

To form a pattern layout less liable to latch up, for example, the element region of the transfer gate may be surrounded by a diffused region of the same conductivity as that of the substrate and of a higher impurity concentration than that of the substrate, with the diffused region being well connected to the substrate potential supply line. This enables noises generated at the transfer gates to be absorbed in the substrate potential supply source via the diffused region. Like the transfer gate, the elements of the decoder may be enclosed by a diffused region of the same conductivity as that of the substrate and of a higher impurity concentration than that of the substrate, with the diffused region being well connected to the substrate potential supply line. This stabilizes the potential of the decoder substrate, making the latching up less liable to occur.

In the FIG. 2 multiplexer, to avoid latching up, both the element region of the transfer gate and that of the decoder are surrounded by the diffused regions whose impurity concentration is higher than that of the substrate, with the diffused regions being well connected to the power supply lines of the decoder to boost the substrate potential supply.

Figure 3:
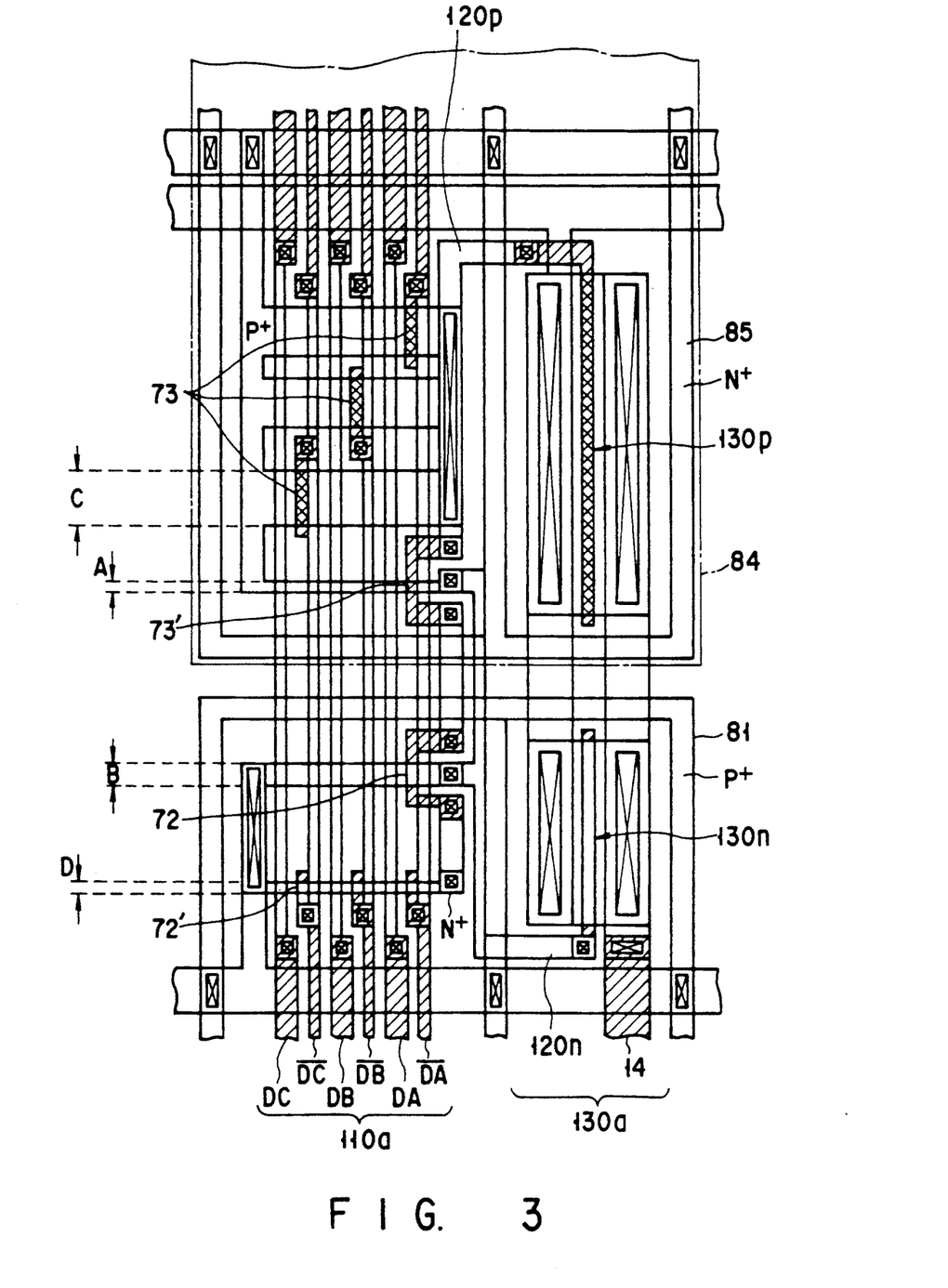
FIG. 3 shows a mask pattern for a multiplexer circuit according to a second embodiment of the present invention.

FIG. 3 illustrates a mask pattern for a second embodiment of the present invention.

Referring to the FIG. 2 circuit diagram, the FIG. 3 mask pattern view, and the FIG. 8 timing chart, an explanation will be given as to how the transfer gates are prevented from turning on simultaneously by partially adjusting the operating speed of the logic circuits to place all transfer gates in a high impedance state at the time when the output changes.

In the circuit of FIG. 2, when $\overline{DA}$, $\overline{DB}$, and $\overline{DC}$ change from (0, 0, 0) to (0, 0, 1), the output 120p of the NAND circuit 110A changes from 0 to 1, which causes the output of inverter 110B to change from 1 to 0, resulting in the transfer gate 130 changing from the on to the off state. On the other hand, the output 121p of the NAND circuit 111A changes from 1 to 0, which causes the output of inverter 111B to change from 0 to 1, resulting in the transfer gate 131 changing from the off to the on state.

As shown in column I in FIG. 8, however, the transfer gates 130 and 131 will turn on simultaneously unless any suitable means is provided.

To avoid this, the turning on of the transfer gate 131 may be delayed, as shown in column III, by: (1) for 121p, delaying the response to the falling of the logic signal, and (2) for 121n, delaying the response to the rising of the logic signal.

Specifically, in the transistor with the output 121p in item (1), the width of the p-type gate (A in FIG. 3) of the FIG. 2 inverter circuit 110B is made narrower than that of the n-type gate (B in FIG. 3). In the transistor with the output 121n in item (2), the gate width of the p-type transistor (C in FIG. 3) of the 3-input NAND gate of FIG. 2 is made wider than that of the n-type transistor gate (D in FIG. 3). Giving the particular transistors suitably different driving capabilities provides the logic signals as shown in column III in FIG. 8. The output 120p of NAND circuit 110A changes from 0 to 1 fast, as does the output 120n of inverter 110B from 1 to 0. In contrast, the NAND circuit 111A changes from 0 to 1 slowly, as does the inverter 111B from 1 to 0.

This causes transfer gate 130 to turn on, and then transfer gate 131 to turn on, which eliminates a period of time during which both gates turn on simultaneously, preventing the latching up. The suitable drawn current in column III is one flowing in the proper operation of the multiplexer.

Figure 5:
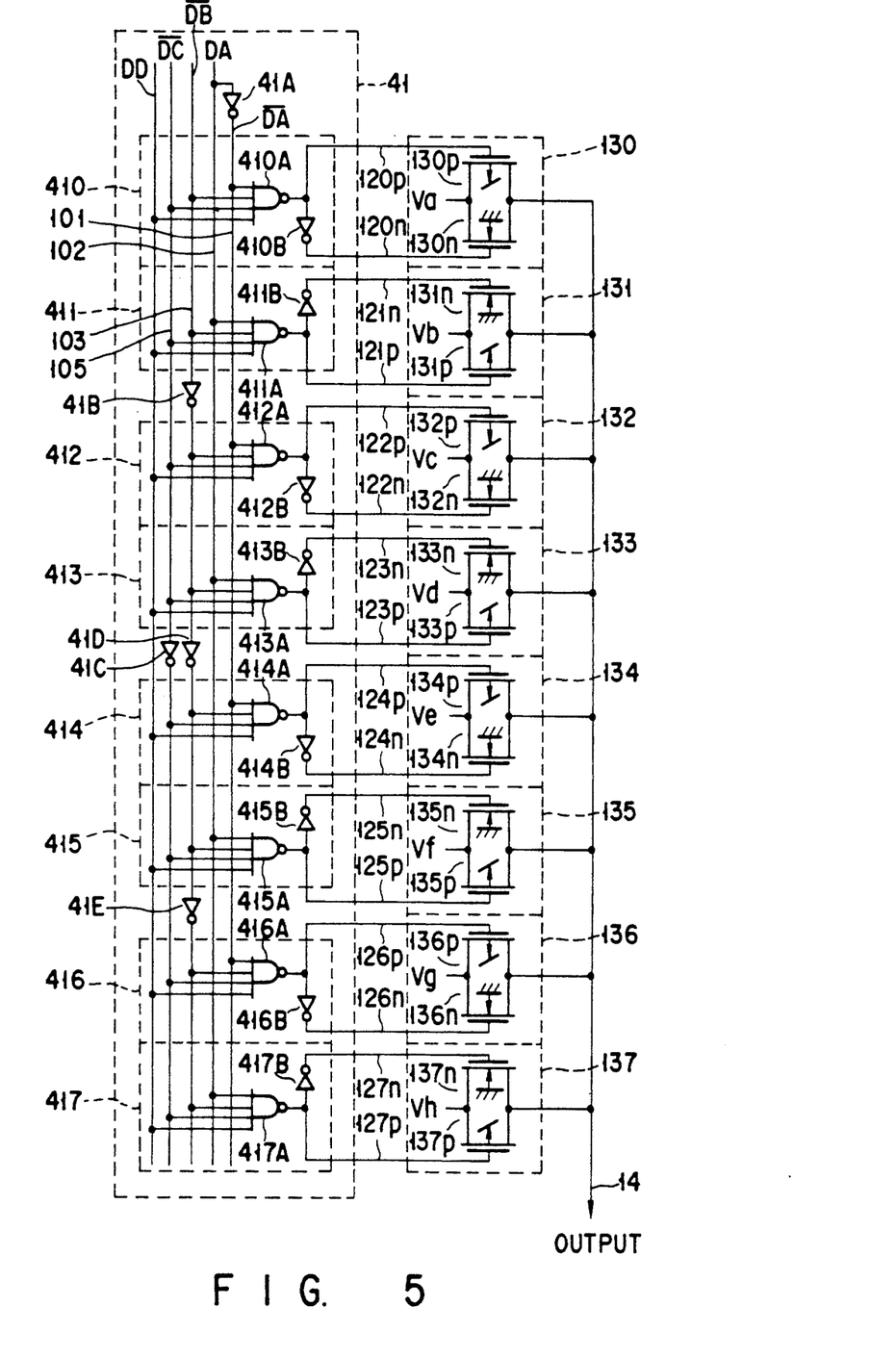
FIG. 5 is a circuit diagram of another embodiment of the present invention.

FIG. 5 shows a circuit diagram of another embodiment of the FIG. 2 multiplexer, corresponding to its pattern layout. The same parts as those in FIG. 2 are indicated by the same reference characters. This multiplexer differs from the FIG. 2 multiplexer in that inverters 41B to 41E are inserted in at least one of decode signal lines 101, 102, 103, and 105 placed in the direction in which decoders 410 to 417 are arranged, and between the areas of decoders 410 to 417, with some of the decoders being supplied with the decode signal from the input side of any one of the inverters 41B to 41E, and the rest of the decoders being supplied with the decode signal from the output side of any one of the inverters 41B to 41E. In a practical example, when DA, $\overline{DB}$, and $\overline{DC}$ are supplied as the decode signals, the decode signal DA is reversed at inverter 41A on the input side of the decoder section to produce a decode signal $\overline{DA}$ the decode signal $\overline{DC}$ is reversed at inverter 41C located between the decoders 413 and 414 to produce a decode signal DC; the decode signal $\overline{DB}$ is reversed at inverter 41B located between the decoders 411 and 412 to produce a decode signal DB; the decode signal DB is reversed at inverter 41D located between the decoders 413 and 414 to produce a decode signal $\overline{DB}$ and the decode signal $\overline{DB}$ is reversed at inverter 41E located between the decoders 415 and 416 to produce a decode signal DB. By producing the inverted signals of the decode signals using the inverters located between the areas of the decoders 410 to 417, the number of decode signal lines 101, 102, 103, and 105 can be reduced, which makes the lateral dimension of the pattern area much smaller, thereby decreasing the entire pattern width in incorporating many multiplexers of the same function.

Figure 6:
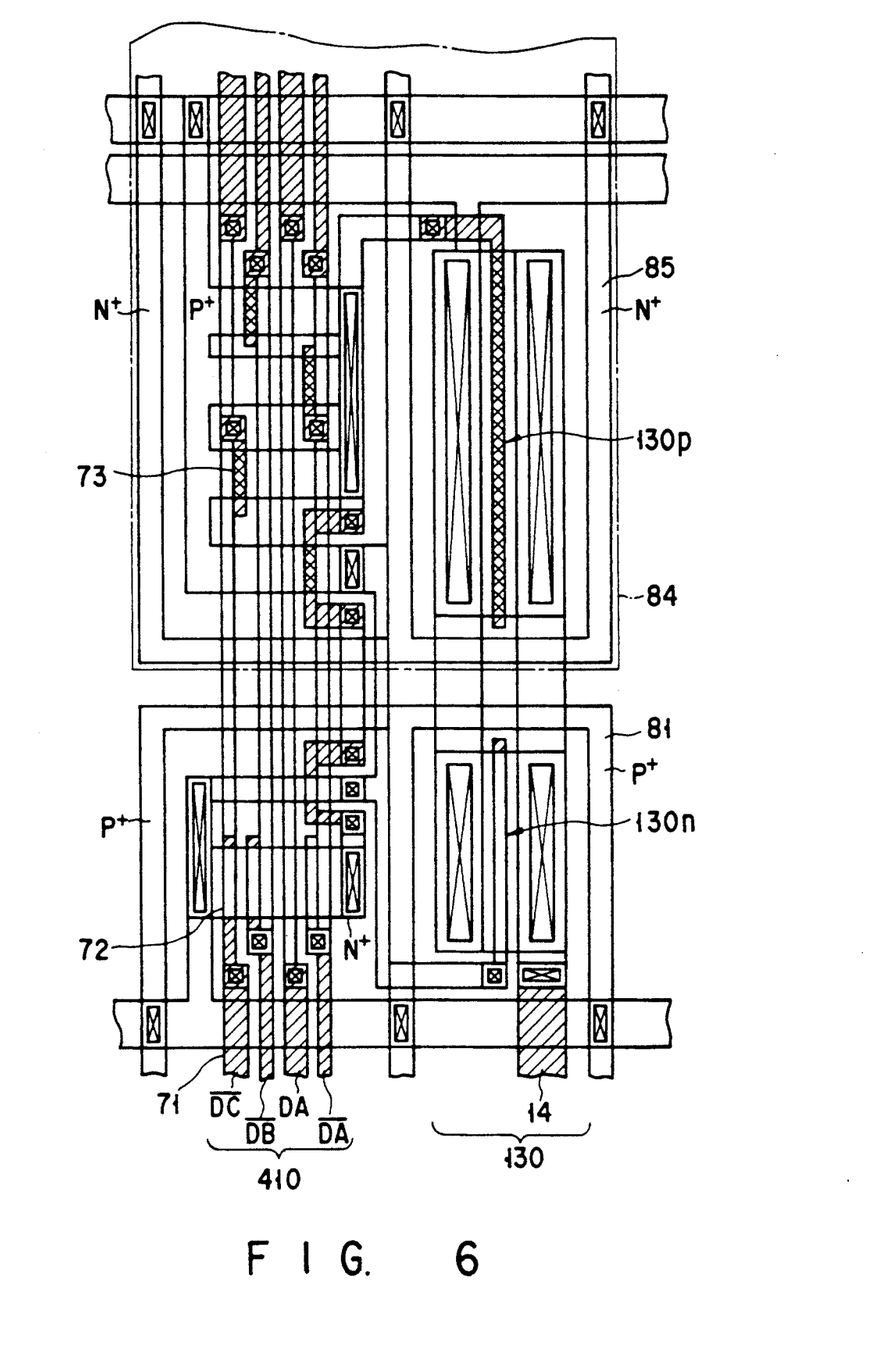
FIG. 6 illustrates a mask pattern associated with the circuit pattern of the FIG. 5 embodiment.

FIG. 6 illustrates a portion (the decoder 410 and transfer gate 130) of the pattern of the FIG. 5 multiplexer. In this pattern, decode signals DA, $\overline{DB}$, and $\overline{DC}$ and decode signal $\overline{DA}$ are transmitted via the polysilicon interconnection line 71 and aluminium interconnection line 74. The polysilicon interconnection line 71 carrying inverted signals $\overline{DA}$, $\overline{DB}$, and $\overline{DC}$ is connected to the gate electrode 72 of each of series-connected NMOS transistors and to the gate electrode 73 of each of parallel-connected PMOS transistors of the 3-input NAND gate 110A. The rest of the pattern is the same as that of FIG. 3.

As described above, with the present invention, since selection of the output from many potentials can be achieved with a small pattern area, it is possible to provide a multiplexer capable of suppressing an increase in the chip size in packing many multiplexers of the same function in the integrated circuit device. For example, the effect of this invention is remarkable when applied to the liquid-crystal panel driving CMOS integrated circuit device. Using the decoder's power supply also as the substrate potential supply source for the transfer gate provides a sufficient substrate potential for the transfer gates, stabilizing the operation of the transfer gates.

Further, because the present invention is constructed as described earlier, the faulty operation stemming from the logic circuit configuration or variations in the capacitance of the circuits can be eliminated in the gates of the multiplexer controlled by the positive and negative logic signals. Specifically, at the time when the change of digital signals switches the transfer gates to be turned on, all transfer gates are turned off for a certain period of time, thereby preventing the transfer gates from turning on simultaneously.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multiplexer circuit comprising:
   a plurality of means for decoding digital timing signals;
   a plurality of means for passing an analogue potential to an output terminal corresponding to a decoded result of the decoding means, and preventing the passing means from passing more than one signal simultaneously; and
   means for supplying a timing signal to the decoding means at the time when the digital signals change, thereby preventing a plurality of the passing means from turning on simultaneously.

2. A multiplexer circuit according to claim 1, wherein the passing means contains complementary MOS transistors, and the decoding means contains logic circuits to control the operation of MOS transistors of a first conductivity type of the passing means, and inverter circuits to control the operation of MOS transistors of a second conductivity type of the passing means.

3. A multiplexer circuit according to claim 1, wherein the timing signal is supplied to the supplying means before the digital signals change.

4. A multiplexer circuit according to claim 1, wherein the decoding means contains an inverter circuit for producing negative logic signals of the digital signals.

5. A multiplexer circuit according to claim 1, wherein the passing means contains complementary MOS transistors, and the decoding means contains logic circuits to control the operation of MOS transistors of a first conductivity type of the passing means, and inverter circuits to control the operation of MOS transistors of a second conductivity type of the passing means.

6. A multiplexer circuit according to claim 5, wherein the logic gate circuit has a current driving capability of the first conductivity-type MOS transistors set larger than another current driving capability of the second conductivity-type MOS transistors.

7. A multiplexer circuit according to claim 5, wherein the inverter circuit has a current driving capability of the first conductivity-type MOS transistors set larger than another current driving capability of the second conductivity-type MOS transistors.

8. A multiplexer circuit according to claim 5, wherein MOS transistors of the decoding means are formed below an interconnection area in which the digital signals are supplied to the decoding means.

9. A multiplexer circuit according to claim 5, wherein the decoding means is supplied with power in the form of the substrate potential of the passing means.

10. A multiplexer circuit according to claim 5, wherein the decoding means contains an inverter circuit for producing negative logic signals of the digital signals.

11. A multiplexer circuit comprising:
    a plurality of means for decoding digital timing signals;
    a plurality of means for passing an analogue potential to an output terminal corresponding to a decoded result of the decoding means, and preventing the passing means from passing more than one signal simultaneously;
    means for supplying a timing signal to the decoding means at the time when the digital signals change, thereby preventing a plurality of the passing means from turning on simultaneously; and
    wherein the passing means contains complementary MOS transistors, and the decoding means contains logic circuits to control the operation of MOS transistors of a first conductivity type of the passing means, and inverter circuits to control the operation of MOS transistors of a second conductivity type of the passing means, each logic gate circuit having a first gate width of the first conductivity-type MOS transistors set larger than a second gate width of the second conductivity-type MOS transistors, and each inverter circuit having a third gate width of the first conductivity-type MOS transistors set larger than a fourth gate width of the second conductivity-type MOS transistors.

12. A multiplexer circuit comprising:
    a semiconductor substrate having a plurality of means for decoding digital timing signals;
    a plurality of means, formed in a line on the semiconductor substrate, for transferring a potential from the decoding means to an output terminal;
    means for supplying a time signal to the decoding means at the time when the digital signals change, thereby preventing a plurality of the transferring means from turning on simultaneously; and
    a plurality of means, formed on the semiconductor substrate so as to be electrically coupled to the transferring means, respectively, for controlling the operation of the transferring means corresponding to the decoded result of the decoding means.

13. A multiplexer circuit according to claim 12, wherein MOS transistors of the decoding means are formed below the interconnection area in which the digital signals are supplied to the decoding means.

14. A multiplexer circuit according to claim 12, wherein the decoding means is supplied with power in the form of the substrate potential of the transfer means.

* * * * *